(12) United States Patent
Tanaka

(10) Patent No.: US 7,782,137 B2
(45) Date of Patent: Aug. 24, 2010

(54) DIFFERENTIAL CIRCUIT PROVIDING A FUNCTION TO CANCEL INPUT OFFSET VOLTAGE

(75) Inventor: Keiji Tanaka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 72 days.

(21) Appl. No.: 12/232,015

(22) Filed: Sep. 9, 2008

(65) Prior Publication Data

US 2009/0079502 A1    Mar. 26, 2009

(30) Foreign Application Priority Data

Sep. 13, 2007   (JP) .............................. 2007-238215

(51) Int. Cl.
  *H03F 3/45* (2006.01)
(52) U.S. Cl. ............................. 330/259; 330/9; 330/260
(58) Field of Classification Search ............. 330/9, 330/259, 260; 327/307
  See application file for complete search history.

(56) References Cited

U.S. PATENT DOCUMENTS 5,798,664 A * 8/1998 Nagahori et al. ............ 330/259
6,903,593 B2 * 6/2005 Wang ........................ 327/307
7,411,446 B2 * 8/2008 Kao ............................. 330/9

FOREIGN PATENT DOCUMENTS

JP      2001-274640       10/2001

OTHER PUBLICATIONS

Sony CXB1810FNCatalogue, "Post Amplifier for Optical Fiber Communication Receiver", pp. 1-17.

* cited by examiner

*Primary Examiner*—Khanh V Nguyen
(74) *Attorney, Agent, or Firm*—Smith, Gambrell & Russell, LLP

(57) ABSTRACT

A new offset canceling circuit for a differential circuit is disclosed whose input offset voltage may be cancelled independent of the variation of the input level, accordingly, enables the cut-off frequency of the canceling circuit unchanged. The offset canceller of the invention provides a buffer amplifier and a filter. The filter includes a capacitance multiplier including an operational amplifier (Op-Amp) operating in the inverting mode and a capacitor connected between the input and output of the Op-Amp. The Op-Amp operating in the inverting mode whose closed loop gain is solely determined by resistors, and the capacitance of the capacitor is multiplied by the closed loop gain of the Op-Amp by the Miller effect.

11 Claims, 10 Drawing Sheets

PRIOR ART

DIFFERENTIAL CIRCUIT PROVIDING A FUNCTION TO CANCEL INPUT OFFSET VOLTAGE

BACKGROUND OF THE INVENTION

1. Field of the Invention

The present invention relates to a circuit to cancel a DC offset appeared in a differential circuit, and a differential circuit providing this offset canceller.

2. Related Prior Art

A differential circuit, especially a circuit applied in an optical communication system, is necessary to amplify a signal with a broadband width from low frequencies, typically 1 kHz, to high frequencies, typically 1 MHz. Such a differential circuit usually provides a DC offset canceller including a low-pass filter or an integrator accompanied with a capacitor. Because of its large capacitance, the capacitor in the low-pass filter or the integrator often configures as an external capacitor, which inevitably forces the IC to provide additional two lead pins for the external capacitor. When the capacitor for the low-pass filter or the integrator is set within the IC, the die area must be enlarged, which raises the cost of the IC.

A Japanese Patent published as 2001-274640A has disclosed a circuit to increase the capacitance able to be built within the IC equivalently by using the Miller effect inherently observed in the inverting amplifier. However, this circuit varies the trans-conductance gm of the transistor depending on the gate bias, which also changes the gain of the inverting amplifier and the capacitance obtained by the Miller effect. Applying this offset canceller to the differential circuit for the optical communication system, the instability of the input bias due to a change of the ambient and operational temperature and a drift of the power supply or the input signal with relatively low frequency components change the Miller capacitance of the inverting amplifier, which makes the cut-off frequency of the filter or the integrator instable; thus the signal quality in the lower frequencies is degraded.

SUMMARY OF THE INVENTION

An aspect of the present invention relates to a differential amplifier with a function to cancel the input offset voltage. The differential amplifier of the invention comprises (a) a primary amplifier with the differential configuration and (b) an offset canceller includes a buffer amplifier also with the differential configuration and a low-pass filter. The low-pass filter includes a filtering resistor and a capacitance multiplier with a capacitor and a Miller amplifier. The mirror amplifier may artificially increase the capacitance of the capacitor connected between the input and the output of the Miller amplifier.

A feature of the present differential circuit, in particular, a feature of the offset canceller of the invention is that the Miller amplifier has a closed loop gain independent of an input level thereof. That is, even when the input level fluctuates, the closed loop gain of the Miller amplifier is kept invariant to set the Miller capacitance viewed from the filtering resistor constant. Therefore, the cut-off frequency of the low-pass filter may be kept constant.

The Miller amplifier of the invention may include a differential amplifier and resistors each connected with the differential amplifier so as to constitute an inverting amplifier. The closed loop gain of this inverting amplifier is solely determined by the resistance ratio of these resistors; thus, the gain may be free from the input level of the inverting amplifier. The differential amplifier may be a general purpose operational amplifier easily available in the market.

The differential amplifier in the capacitance multiplier may be variable in its closed loop gain by varying the resistance of the resistors, or, the differential amplifier may be adjustable in the output level thereof by an external command. Or, the filtering resistor in the low-pass filter may be a trans-conductance amplifier.

BRIEF DESCRIPTION OF DRAWINGS

FIG. 3A is a Bode plot of the filter at the input thereof, FIG. 3B is a Bode plot of the filter at the output, and FIG. 3C is a Bode plot of the closed loop including the offset canceller of the differential circuit;

DESCRIPTION OF PREFERRED EMBODIMENTS

Next, preferred embodiment of the present invention will be described in detail as referring to accompanying drawings. In the description of the drawings, the same numerals or symbols will refer to the same elements without overlapping explanations.

First Embodiment

Figure 1:
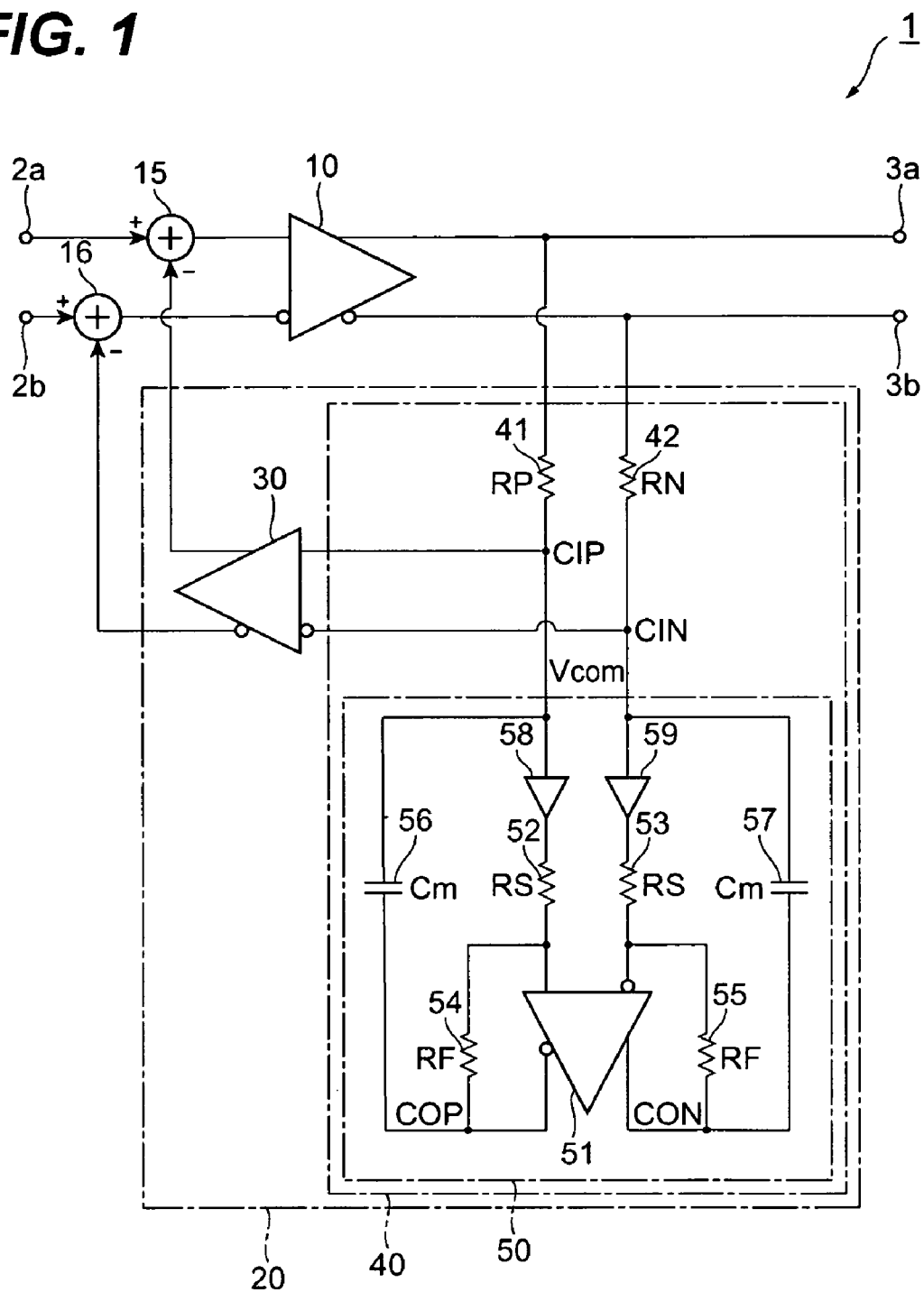
FIG. 1 illustrates a circuit diagram of the differential amplifier with the offset canceller according to the first embodiment of the invention.

FIG. 1 illustrates a circuit diagram of a differential circuit and an offset canceller according to the first embodiment of the invention. The 1 provides a pair of input terminals, 2a and 2b, a pair of output terminals, 3a and 3b, a primary amplifier 10, an offset canceller 20 and two subtractors, 15 and 16.

The primary amplifier 10, put between two input terminals, 2a and 2b, and two output terminals, 3a and 3b, is connected in the non-inverting input thereof with the input terminal 2a through the 15, while, in the inverting input thereof is coupled with the input terminal 2b through the other 16. The non-inverting output of the primary amplifier 10 is directly coupled with the output terminal 3a, while, the inverting output thereof is coupled with the other output terminal 3b. Here, the inverting and the non-inverting merely mean that the signals output therefrom or input thereto have phases opposite to each other.

The primary amplifier 10 typically comprises a plurality of differential circuits connected in series to each other, which results in a large total gain of the primary amplifier 10. Accordingly, because the practical differential circuit inevitably accompanies with a DC offset, the output of the amplifier with a large total gain likely to saturate even when the DC offset is slight.

The offset canceller 20 feedbacks the output of the primary amplifier 10 to the input thereof so as to cancel the DC offset of the primary amplifier 10. The offset canceller 20 includes a buffer amplifier 30 and a filter 40. The non-inverting input of the buffer amplifier 30 is coupled with the non-inverting output of the primary amplifier 10 through the filter 40, while, the inverting input of the buffer amplifier 30 is coupled with the inverting output of the primary amplifier 10 through the filter 40 in another phase path thereof. The non-inverting input of the buffer amplifier 30 is coupled with the non-inverting input of the primary amplifier 10 through the 15, while, the inverting input of the buffer amplifier 30 is coupled through the 16 with the inverting input of the primary amplifier 10.

Thus, the filter 40 is put between the outputs of the primary amplifier 10 and the buffer amplifier 30. The subtractors, 15 and 16, subtract the feedback signals output from the offset canceller 20 from the input signals applied to the input terminals, 2a and 2b.

Next, the filter 40 will be described in detail. The filter 40 includes first and second resistors, 41 and 42, and a capacitance multiplier 50. The first resistor 41, put between the non-inverting output of the primary amplifier 10 and the capacitance multiplier 50. The node CIP between the first resistor 41 and the capacitance multiplier 50 is connected with the non-inverting input of the buffer amplifier 30. The second resistor 42 is put between the inverting input of primary amplifier 10 and capacitance multiplier 50. The node CIN between the second resistor 42 and capacitance multiplier 50 is connected with the inverting input of the buffer amplifier 30. The capacitance multiplier 50 includes a Miller amplifier 51, typically an operational amplifier (hereafter denoted as Op-Amp) for general purposes, third to sixth resistors, 52 to 55, first and second capacitors, 56 and 57, and two buffer units, 58 and 59.

The non-inverting input of the Op-Amp 51 is coupled with the first resistor 41 through the third resistor 52 and the buffer unit 58, while, the inverting input of the Op-Amp 51 is coupled with the second resistor 42 through the fourth resistor 53 and the buffer unit 59. Between the non-inverting input and the inverting output of the Op-Amp 51 is provided with the fifth resistor 54, while, the sixth resistor 55 is connected between the inverting input and the non-inverting output of the Op-Amp 51. Between the first resistor 41 and the inverting output of the Op-Amp 51 is coupled with the first capacitor 56, while, the second capacitor 57 is connected between the second resistor 42 and the non-inverting output of the Op-Amp 51.

The present embodiment provides the buffer unit 58 between the first resistor 41 and the third 52, while, it provides the other buffer unit 59 between the second resistor 42 and the fourth resistor 53. These buffer units, 58 and 59, generally including a CMOS transistor in the front stage thereof, may compensate the input current offset of the Op-Amp 51.

Thus, the capacitance multiplier 50 may equivalently provide the Miller capacitor to the node CIP, which is derived from the first capacitor 56 and the capacitance thereof is multiplied by the closed loop gain of the Op-Amp 51 added by unity, and another Miller capacitor to the node CIN derived from the second capacitor 57 whose capacitance is multiplied by the closed loop gain of the Op-Amp 51 added by unity. These Miller capacitors and two resistors, 41 and 42, operate as the low-pass filter.

Assuming that the resistance of the resistors, 52 and 53, is RS and that of the resistors, 54 and 55, is RF, the DC gain of the capacitance multiplier 50 comprised of the Op-Amp 51 and four resistors, 52 to 55, becomes RF/RS. This capacitance multiplier keeps the DC gain, RF/RS, within a bandwidth determined by the gain-bandwidth product of the Op-Amp 51.

The first and second buffer units, 58 and 59, may isolate the DC load of the Miller amplifier from the filter 40; accordingly, the capacitance CM between nodes, CIP and CIN, may be calculated as:

$$CM = (1+RF/RS) \times Cm/2 \tag{1}$$

where Cm is the capacitance of the first and second capacitors, 56 and 57. Further, the capacitance CMS of CIP or CIN, which equivalently becomes the capacitance of respective nodes with respect to the ground:

$$CM = 2 \times CM = (1+RF/RS) \times Cm. \tag{2}$$

The pole $p_1$ of the filter 40 formed by the Miller capacitance CM of the capacitance multiplier 50 and the first resistor 41 whose resistance is denoted as RP, where the resistance RN of the second resistor 42 is set equal to that of the first resistor 41, is given by:

$$p_1 = RP \times CMS = RP \times (1+RF/RS) \times Cm, \tag{3}$$

and the transfer function F of the filter 40 becomes:

$$F(s) = p_1/(s+p_1). \tag{4}$$

Figure 2:
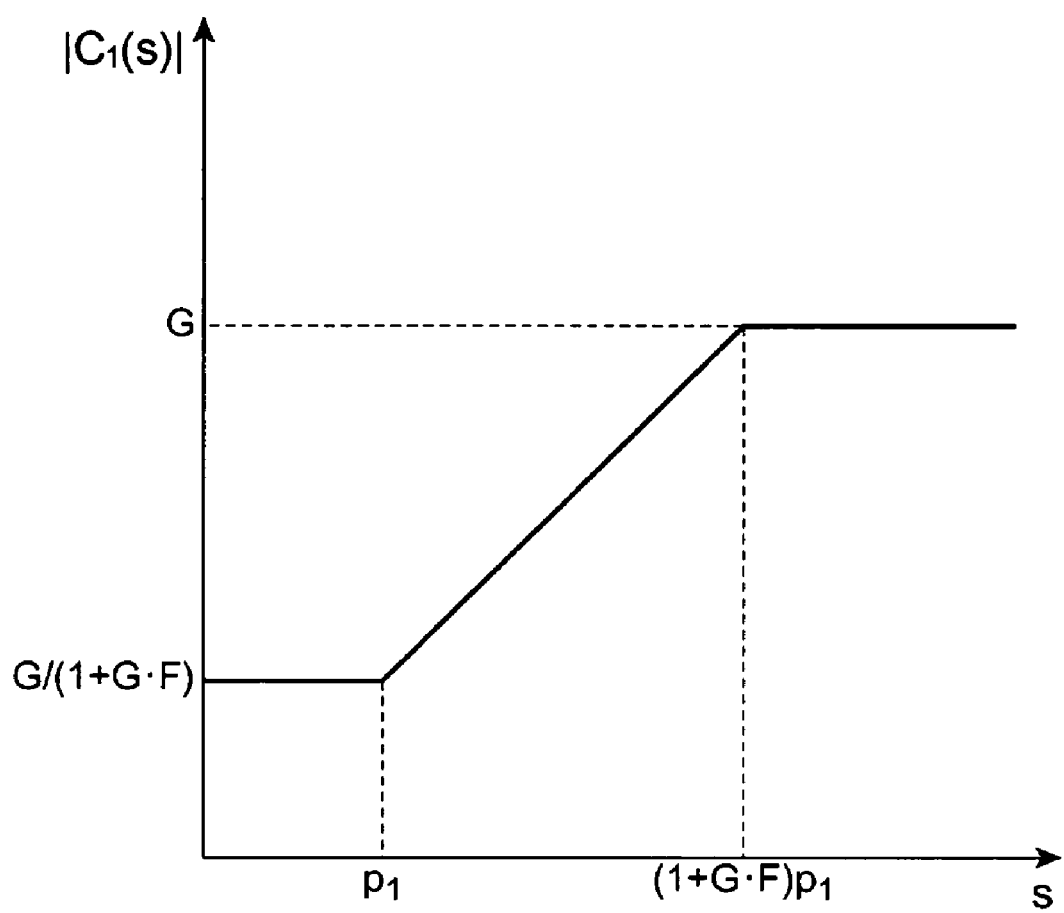
FIG. 2 shows a Bode plot of the closed loop of the differential circuit of the first embodiment.

The transfer function $C_1$ of the closed loop comprised of the filter 40, the buffer amplifier 30, and the primary amplifier 10 becomes:

$$C_1(s) = G \cdot (s+p_1)/\{s+p_1 \cdot (1+G \cdot F)\}, \tag{5}$$

where G is the gain of the primary amplifier 10, and F is the gain of the buffer amplifier 30. FIG. 2 is a Bode plot of the transfer function C1 of the closed loop of the differential circuit 1. The DC offset appeared in the input of the primary amplifier 10 may be compressed by 1/(1+GF), which may prevent the saturation in the output of the primary amplifier 10.

In the offset canceller 20 according to the first embodiment, the Op-Amp 51 and resistors, 52 to 55, constitute an inverting amplifier, where the capacitance multiplier 50 multiplies the capacitance of the first and second capacitors, 56 and 57, depending on the closed loop gain thereof by the Miller effect. Accordingly, the offset canceller 20 may set the cut-off frequency of the low-pass filter 40 low enough even though the resistance of resistors, 41 and 42, and the capacitance of capacitors, 56 and 57, are forced to be set in smaller values. Thus, the differential circuit 1 providing the offset canceller 20 of the first embodiment may be integrated within the IC with the capacitors, 56 and 57.

Moreover, the gain of the inverting amplifier comprised of the Op-Amp 51 and resistors, 52 to 55, are automatically and substantially solely determined by the resistance of the resistors, 52 to 55, and thus determined gain may be kept almost constant independent of the input levels of the capacitance multiplier 50. Therefore, the capacitance multiplier 50 may set the Miller capacitance constant independent of the drift of the inputs thereof, which means that the cut-off frequency of the filter 40 may also be set substantially constant.

The closed loop gain influencing the magnitude of the Miller capacitance is solely determined by the ratio RF/RS, the resistance ratio of the resistors 52 to 54, to that of the sixth and fourth resistors, 53 to 55. Accordingly, the gain of the offset canceller 20 becomes substantially free from the scattering of the practical resistance RF or RS, or the scattering of the practical open loop gain of the Op-Amp 51, which may also set the cut-off frequency of the filter 40 substantially constant.

Figure 9:
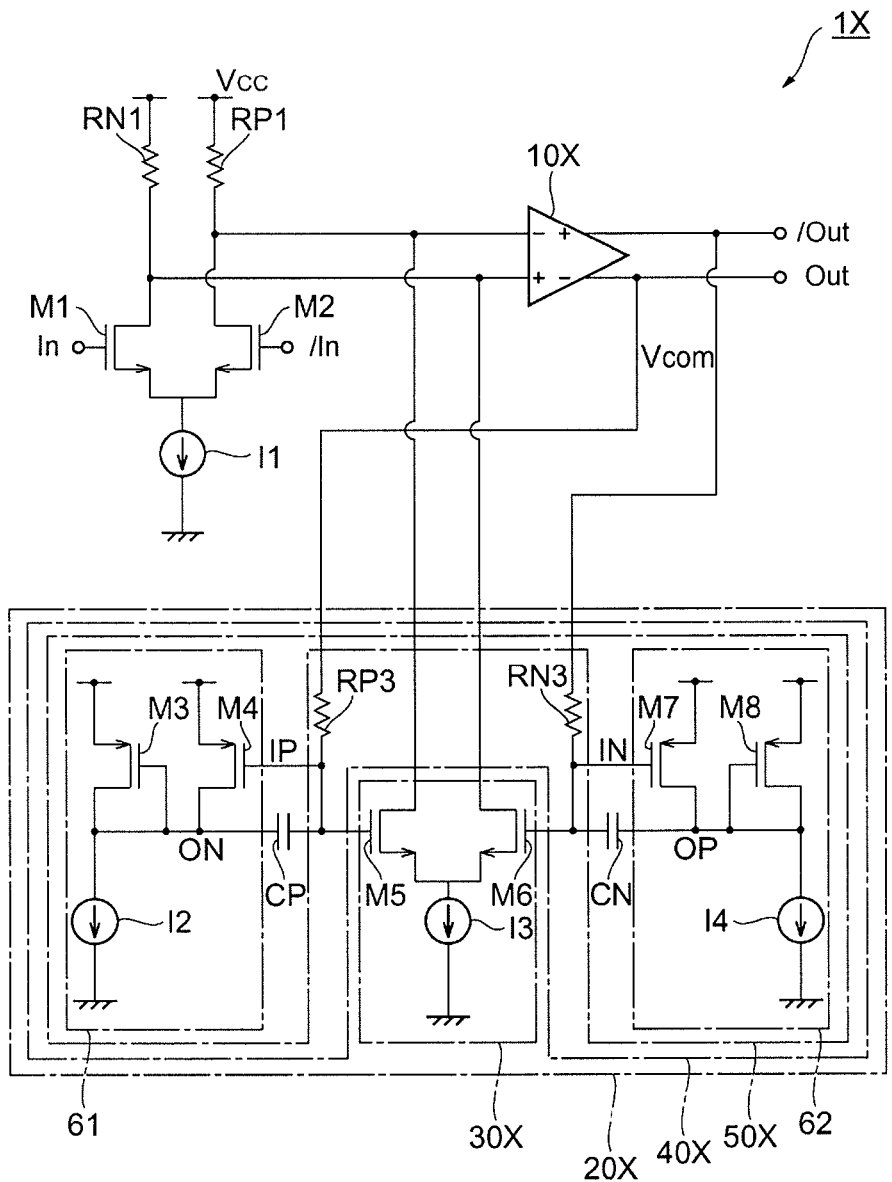
FIG. 9 is the circuit diagram of the differential amplifier with a conventional offset canceller.

Next, numerical calculations evaluate the operation of the offset canceller 20 as comparing with the circuit disclosed in the aforementioned prior art. FIG. 9 illustrates the differential circuit 1X disclosed in the prior art above, which includes a primary amplifier 10X that corresponds to the primary amplifier 10 of the present invention, and a circuit block 20X corresponding to the offset canceller 20 of the present invention. The differential circuit 1X further provides, in the input stage thereof, a differential circuit comprised of two transistors, M1 and M2, accompanied with respective load resistors, RN1 and RP1, and a current source I1.

The circuit block 20X includes a amplifier 30X corresponding to the buffer amplifier 30 and a filter 40X also corresponding to the filter 40 of the present invention. The filter 40X provides two resistors, RP3 and RN3, corresponding to the resistors, 41 and 42, and a capacitor unit 50X corresponding to the capacitance multiplier 50 to generate the Miller capacitor.

The capacitor unit 50X provides two capacitors, CP and CN, corresponding to the capacitors, 56 and 57, and amplifying units, 61 and 62, which are the counterparts of the Op-Amp 51. The input terminals, IP and IN, of the amplifying units, 61 and 62, are connected with the output terminals of the primary amplifier 10X through resistors, RP3 and RN3. The capacitors, CP and CN, are put between the input terminals, IP and IN, and the output terminals, ON and OP of respective amplifying unit, 61 and 62.

The amplifying unit 61 includes two transistors, M4 and M3, and a current source T2. The transistor M3 and the current source I2 operate as load elements for the amplifying transistor M4. The other amplifying unit 62 has substantially same configuration with the amplifying unit 61, that is, the 62 includes two transistors, M7 and M8 and a current source I4. Thus, the capacitor unit 50X generates a mirror capacitor whose capacitance becomes the product of the practical capacitance of the capacitor CP multiplied by the gain of the amplifying unit 61, and another mirror capacitor derived from the capacitor CN with the capacitance multiplied by the gain of the amplifying unit 62.

Figure 10A:
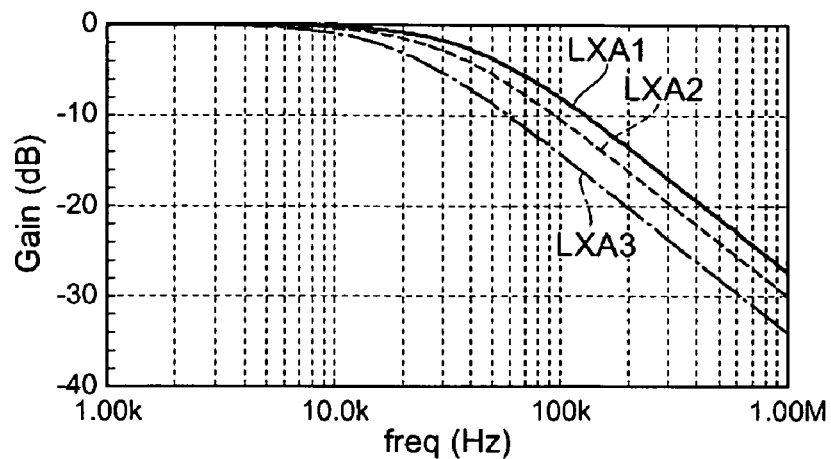
FIG. 10A is the Bode plot of the filter at the input thereof.
Figure 10B:
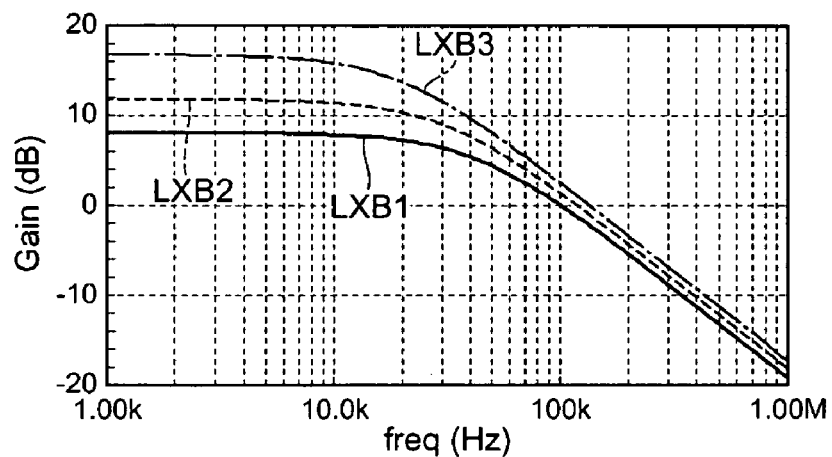
FIG. 10B is the Bode plot of the filter at the output thereof.
Figure 10C:
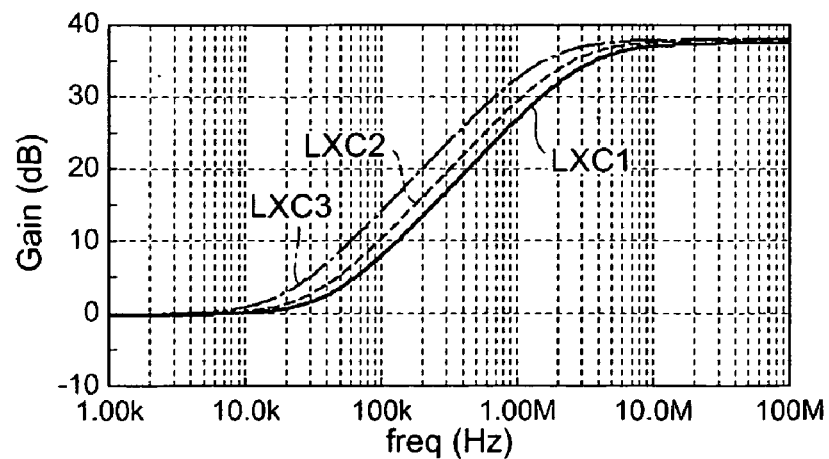
FIG. 10C is the Bode plot of the differential amplifier in the closed loop thereof.

FIGS. 10A to 10C are the Bode plots of the offset canceller 20X shown in FIG. 9. FIG. 10A shows the response of the filter 40X measured between the inputs, IP-IN, of the amplifying units, 61 and 62; FIG. 10B corresponds to the frequency response of the filter 40X between the outputs, OP-ON, of the amplifying units, 61 and 62, and FIG. 10C is the closed loop gain of the differential circuit 1X. The calculation above assumes the followings: RP1=RN1=50Ω, RP3=RN3=100 kΩ, CP=CN=10 pF, I3=2 mA, I2=I4=500 μA, the gain G of the primary amplifier 10X is 100, the size of the load transistors, M3 and M8, is Width/length=10/0.36 μm, and the power supply Vcc is 3.3 V.

Behaviors, LXA1 to LXA3, in FIG. 10A corresponds to cases of Vcom=2.4V, 2.35 V, and 2.3V, respectively, where the parameter Vcom denotes the common mode input of the filter 40X, which is equivalent to the input drift. As shown in FIG. 10A, the common mode input, namely, the input drift, affects the cut-off frequency of the filter 40X. This is because the input drift varies the trans-conductance gm of the transistors, M4 and M7, which results in the gain drift of the amplifying units, 61 and 62, to change the Miller capacitance generated by the capacitor unit 50X.

Behaviors, LXB1 to LXB3, appeared in FIG. 10B show the frequency response of the amplifying units, 61 and 62, for the common mode inputs of, Vcom=2.4 V, 2.35 V, and 2.3 V, respectively. As shown in FIG. 10B, the common mode input, Vcom, equivalently equal to the input drift, varies the response of the filter 40X at low frequencies. Moreover, this variation in the frequency response affects the cut-off frequency of the filter 40X. These variations in the response and the cut-off frequency may be caused by the input drift of only 100 mV.

Behaviors, LXC1 to LXC3, indicate the closed loop gain of the differential circuit 1X for various common mode input, Vcom=2.4 V, 2.35 V, and 2.3 V, respectively. The common mode input, namely, the input drift of the amplifying unit, affects the cut-off frequency of the closed loop by reflecting the frequency response of the filter 40X.

Figure 3A:
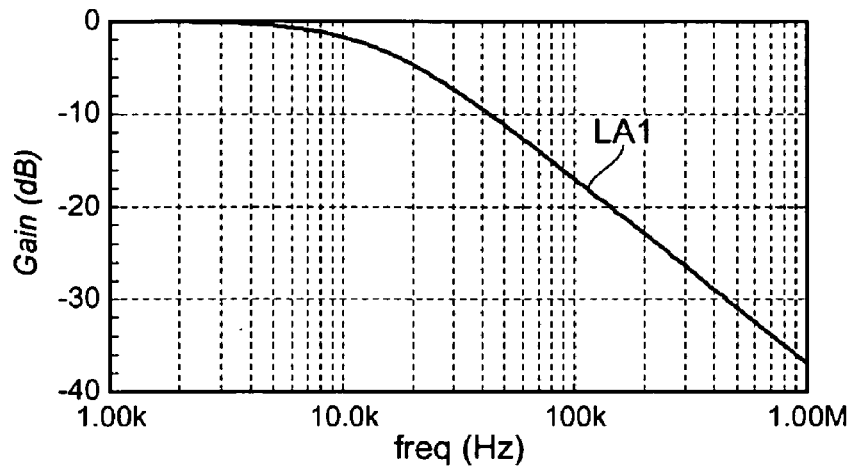
FIGS. 3A to 3C each illustrates the Bode plot calculated for the differential circuit shown in FIG. 1.
Figure 3B:
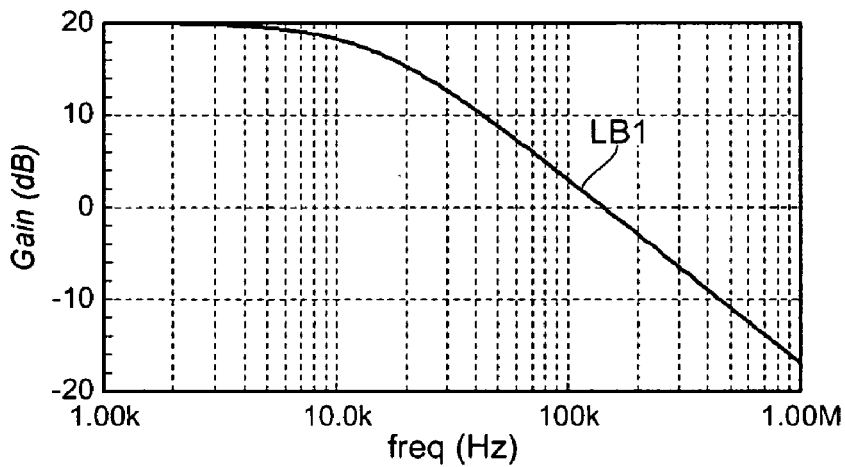
Figure 3C:
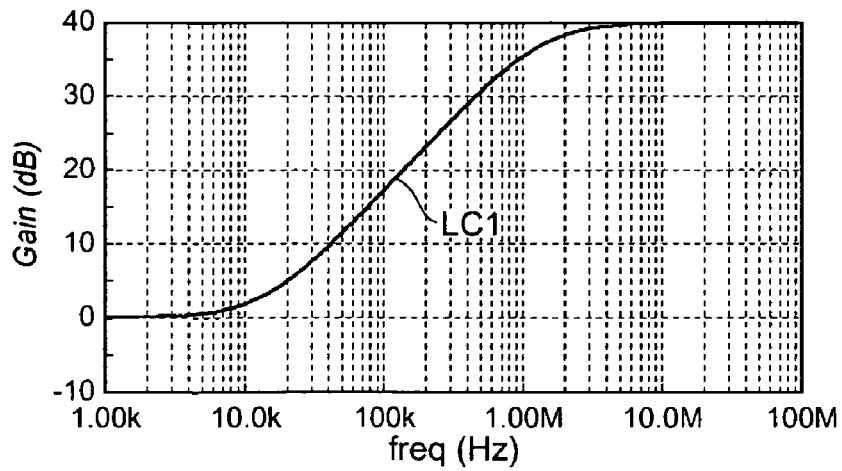

Next, the numerical calculation of the differential circuit 1 according to the present invention will be investigated. FIGS. 3A to 3C show how the frequency response between the inputs, CIP-CIN, between the outputs, COP-CON, of the capacitance multiplier 50, and the closed loop gain of the differential circuit 1, respectively. The numerical calculation assumes the following conditions: RP=RP=100 kΩ, Cm=10 pF, RF/RS=10, the gain G of the primary amplifier 10 is G=100, and the gain F of the buffer amplifier 30 is F=1.

The behavior LA1 in FIG. 3A corresponds to conditions where the common mode input, Vcom, is varied from 2 to 2.3 V. Even when the common mode input, Vcom, which is equivalently equal to the input drift, of the Op-Amp 51 varies, the cut-off frequency of the filter 40 at the inputs, CIP-CIN, of the capacitance multiplier 50 is unchanged. This is because the gain of the capacitance multiplier 50 comprised of the Op-Amp 51 and four resistors, 52 to 55, is decided solely by the resistance ratio RF/RS of the resistors and is substantially independent of the open-loop gain of the Op-Amp 51, which may set the Miller capacitance formed by the capacitance multiplier 50 ultimately constant.

The behavior LB1 in FIG. 3B, which corresponds to the frequency response of the outputs, COP-CON, of the filter 40, may be also unchanged in the cut-off frequency thereof even when the common mode input, Vcom, varies from 2.0 to 2.3 V. In FIG. 3B, the response at lower frequencies may be kept constant at a value of about 20 dB. Accordingly, the cut-off frequency of the filter 40 may be also kept substantially constant.

The Miller capacitance of the capacitors, 56 and 57, are increased by (1+10)/2=5.5 from the practical capacitance Cm according to equation (1) above described, and becomes 55 pF. Therefore, the cut-off frequency fc of the filter 40 based on the equation (3) becomes;

$$fc=1/(2\pi \cdot RP \cdot CMS)=1/(2\pi \cdot 100[k\Omega] \cdot 110[pF])=14.46 \text{ kHz}.$$

As shown in FIG. 3C, the cut-off frequency of the differential circuit 1 in the closed loop gain thereof may be unchanged even when the common mode input, Vcom, of the filter 40 varies from 2.0 to 2.3 V. The cut-off frequency of the differential circuit 1 may be obtained by the product of the cut-off frequency of the filter 40, which is 14.46 kHz, and the closed loop gain of the differential circuit 1 added by unity, which is 1+G·F=101. Accordingly, we may obtain the cut-off frequency of the differential circuit 1 as 1.46 MHz, which means that the DC component, namely, the DC offset in the input of the primary amplifier 10 may be compressed enough.

Second Embodiment

Figure 4:
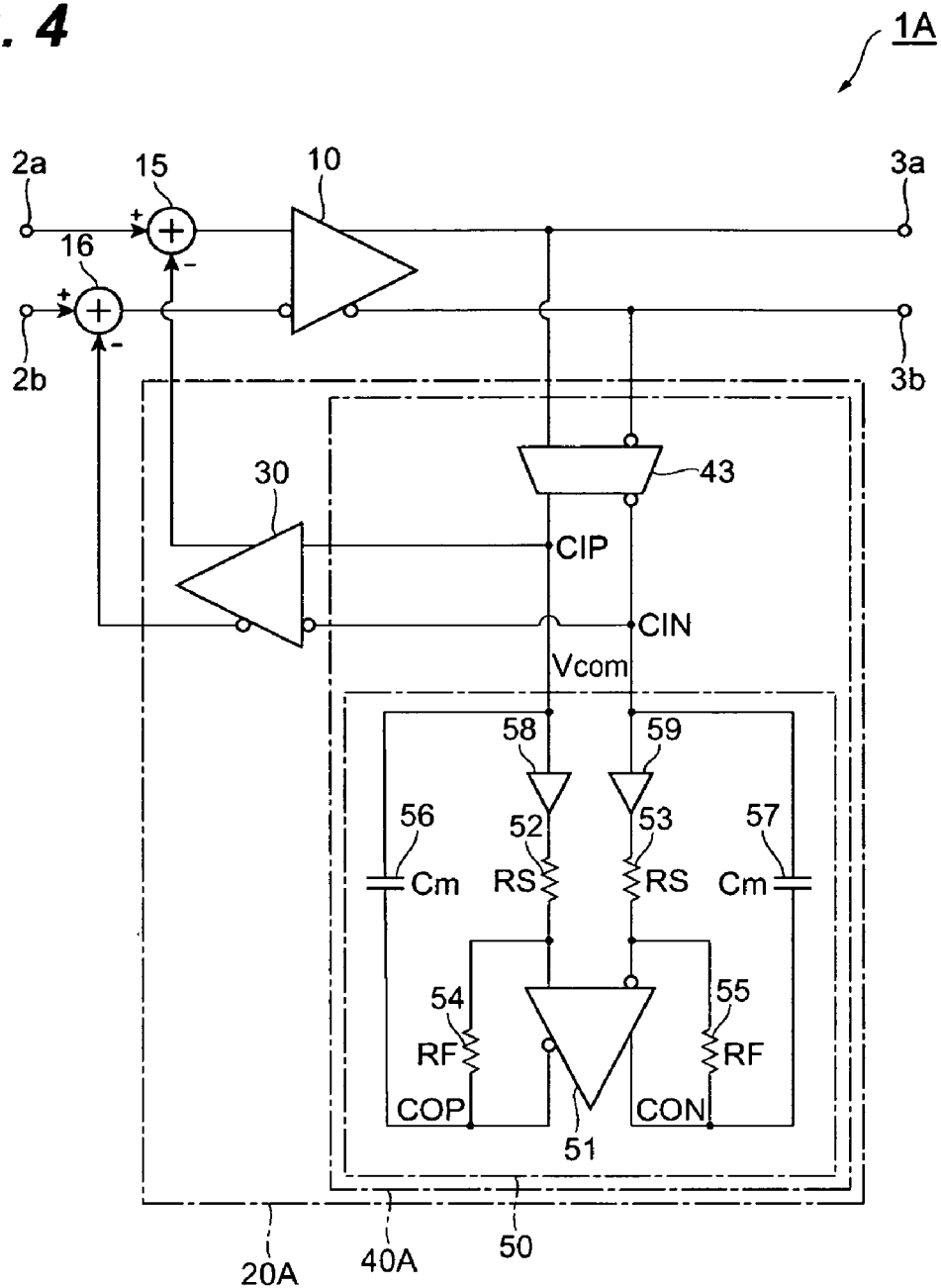
FIG. 4 is a circuit diagram of the differential circuit according to the second embodiment of the invention.

FIG. 4 is a circuit diagram of a differential circuit according to the second embodiment of the present invention. The differential circuit 1A has a different feature from those of the first embodiment shown in FIG. 1 that the differential circuit 1A provides, instead of the offset canceller 20, a modified offset canceller 20A. Other arrangements except for the offset canceller 20A are same with those in the first circuit 1. The offset canceller 20A may be distinguished from the aforementioned offset canceller 20 by the filter 40A. The filter 40A provides a trans-conductance amplifier 43 but removes the first and second resistors, 41 and 42.

The trans-conductance amplifier 43 converts a voltage signal into a current signal. Accordingly, the trans-conductance amplifier 43 may be regarded as a conductive element whose conductance is the inverse of the resistance of a resistor. Because the trans-conductance amplifier 43 has the converting gain, gm [A/V], the filter 40A providing this trans-conductance amplifier 43 operates as an integrator.

Referring to the capacitance CM and the trans-conductance gm in equation (2), the pole $p_2$ of the filter 40A and the transfer function $F_2$ may be denoted as:

$$p_2 = CMS/gm/2 = 2 \cdot Cm \cdot (1 + RF/RS)/gm, \quad (7)$$

$$F_2(s) = p_2/s. \quad (8)$$

The transfer function $C_2$ of the closed loop gain comprised of the filter 40A, the buffer amplifier 30 and the primary amplifier 10 becomes:

$$C_2(s) = G \cdot s/(s + p_2 \cdot G \cdot F). \quad (9)$$

Figure 5:
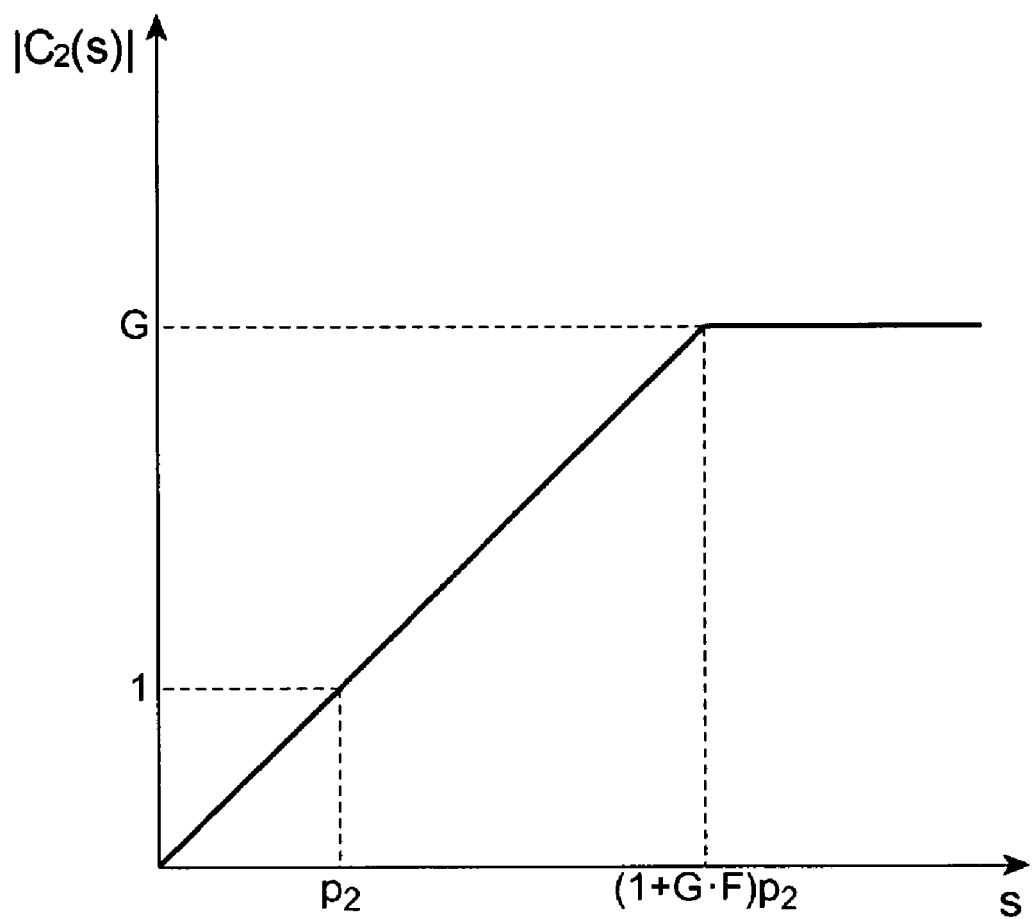
FIG. 5 schematically illustrates a Bode plot of the closed loop of the differential circuit shown in FIG. 4.

FIG. 5 is the Bode plot of the transfer function $C_2(s)$ of the differential circuit 1A. In the differential circuit 1A of the present embodiment, the input DC offset of the primary amplifier 10 may be compressed to substantially zero.

Figure 6A:
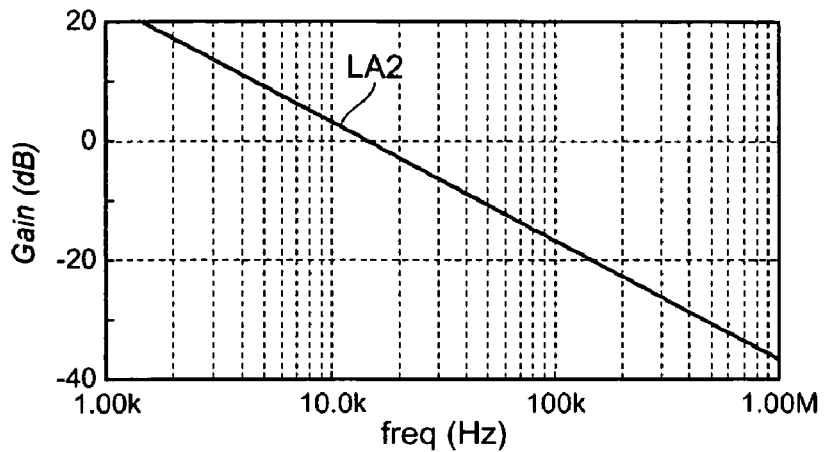
FIG. 6A is a Bode plot of the filter of the second embodiment between the inputs thereof.
Figure 6B:
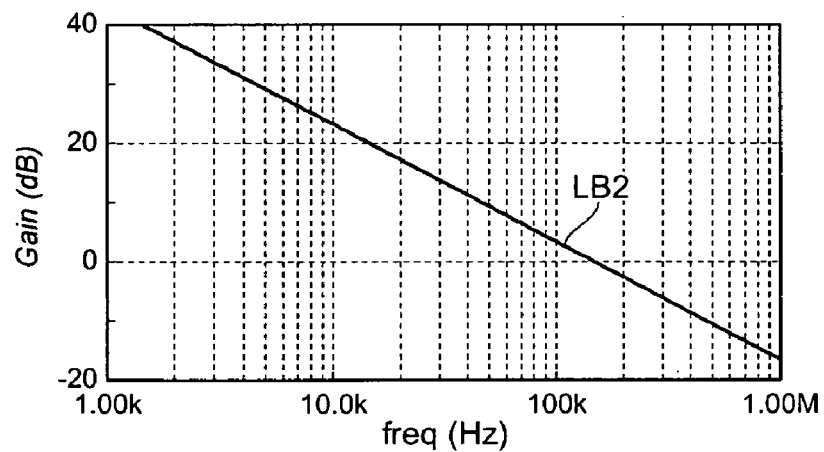
FIG. 6B is a Bode plot of the filter between the outputs thereof.
Figure 6C:
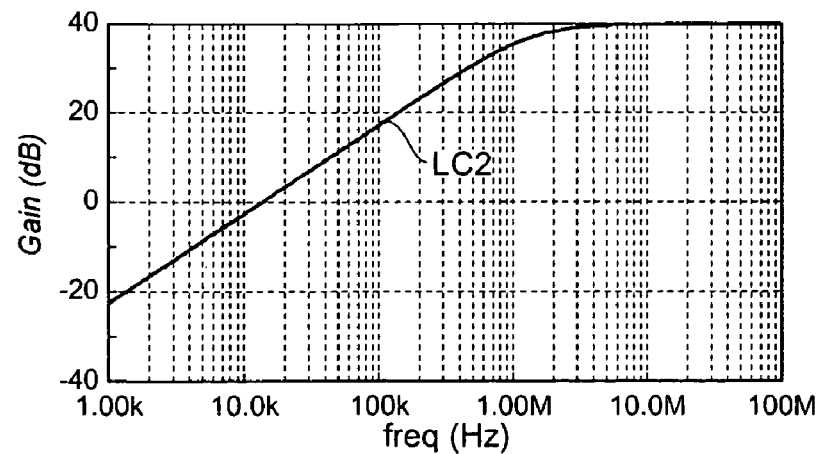
FIG. 6C is a Bode plot of the closed loop including the offset canceller of the second embodiment shown in FIG. 5.

Next, a numerical calculation evaluates the differential circuit 1A with the offset canceller 20A of the second embodiment. FIG. 6A indicates the frequency response of the filter 40A between the inputs, CIP-CIN, of the capacitance multiplier 50; FIG. 6B shows the frequency response of the filter 40A between the output, COP-CON, of the capacitance multiplier 50; and FIG. 6C is the frequency response of the closed loop gain of the differential circuit 1A. This calculation assumes that the conversion gain gm of the trans-conductance amplifier 43 is gm=23 μS and other conditions are the same with those assumed in the calculation for the first differential circuit 1.

The behavior LA2 in FIG. 6A corresponds to cases when the common mode input, Vcom, of the Op-Amp 51 is varied from 2.0 to 2.3 V. Notwithstanding the change of the common mode input, Vcom, the frequency response of the filter 40A between the inputs, CIP-CIN, of the capacitance multiplier 50 is unchanged. The behavior LB1 in FIG. 3B corresponds to cases when the common mode input, Vcom, is varied from 2.0 to 2.3 V. The frequency response of the filter 40A between the outputs, COP-CON, of the capacitance multiplier 50 is also unchanged even when the common mode input Vcom changes.

The Miller effect enhances the capacitance Cm of two capacitors, 56 and 57, multiplied by (1+10)/2=5.5, and the resultant capacitance thereof viewed from respective nodes, CIN and CIP, becomes 110 pF. Thus, we may obtain the cut-off frequency of the filter 40A, based on aforementioned equations (7) and (9);

$$fc = p_2/2/\pi = 1/(2\pi \cdot CMS/(gm/2)) = 1/(2\pi \cdot 10[pF]/10[\mu S]) = 14.46 \text{ kHz}.$$

The behavior LC2 in FIG. 3C indicates the gain characteristic of the differential circuit 1A for cases where the common mode input, Vcom, of the Op-Amp 51 is varied from 2.0 to 2.3 V. The cut-off frequency of the differential circuit 1A may be kept unchanged even when the common mode input, Vcom, is varied. Similar to the circuit 1 of the first embodiment, the cut-off frequency of the closed loop is multiplied by 1+G·F=101, which becomes 1.46 MHz. Moreover, the DC gain or the gain in relatively low frequencies of the primary amplifier 10 may be compressed to substantially zero.

Third Embodiment

Figure 7:
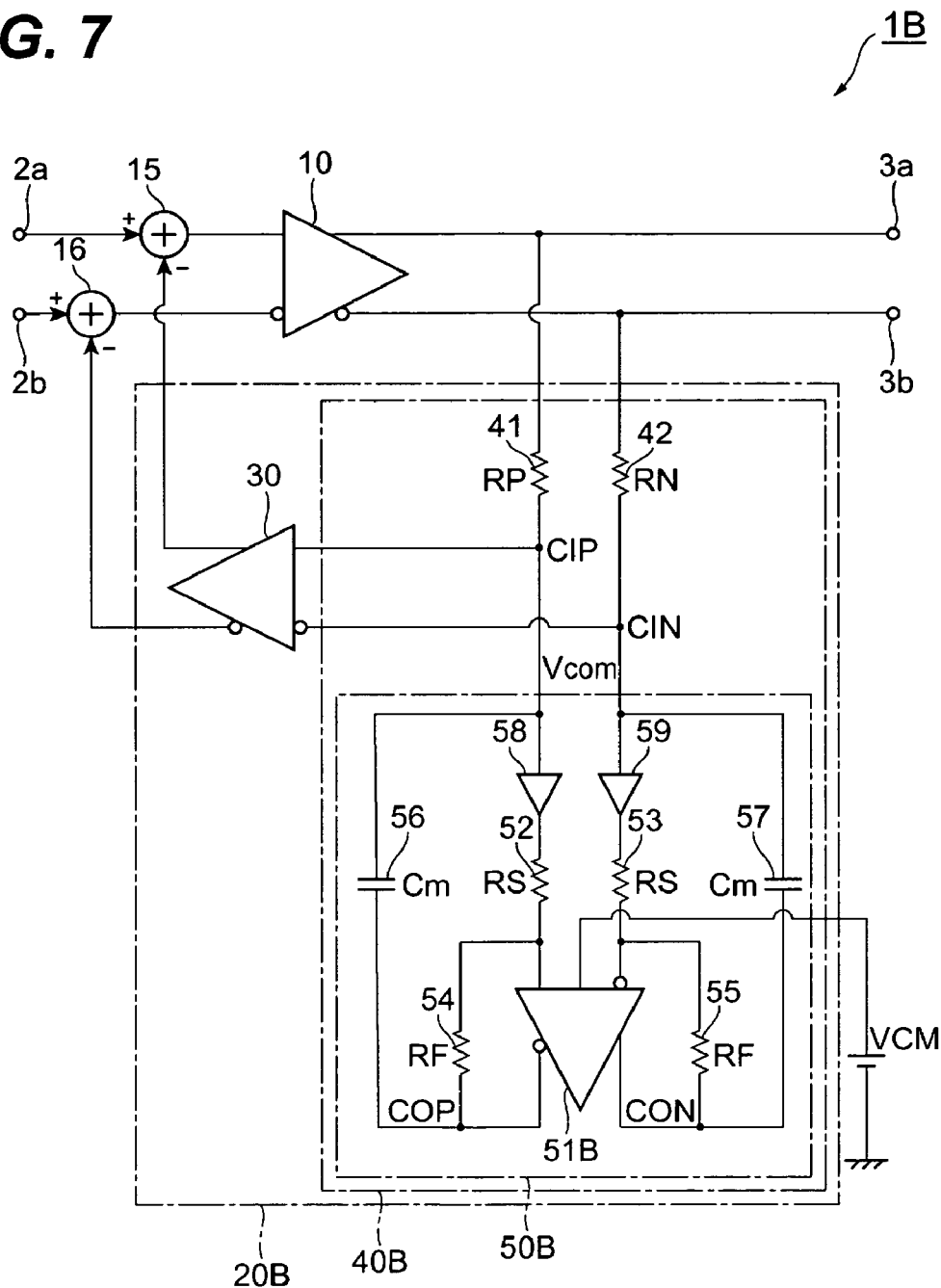
FIG. 7 is a circuit diagram of the differential circuit including another offset canceller according to the present invention.

FIG. 7 shows another modified differential circuit according to the third embodiment of the invention. The third differential circuit 1B has a feature to provide another offset canceller 20B instead of the aforementioned offset canceller 20. Other configurations of the third differential circuit 1B are same with those of the first 1.

The offset canceller 20B provides, in place of the capacitance multiplier 50, a modified capacitance multiplier 50B that includes an Op-Amp 51B. This Op-Amp 51B provides a function to adjust the output level responding to the control signal VCM. The output level of the Op-Amp 51B is desirable to be set in a middle level within an output swing range of the Op-Amp 51B. Other functions of the Op-Amp 51B are same with those of the former Op-Amp 51.

When the closed loop gain of the Op-Amp 51 combined with the resistors, 52 to 55, is large, the capacitance multiplier 50 occasionally causes the saturation in the output level thereof depending on the power supply voltage. However, the Op-Amp 51B may prevent the saturation in the output level because of the function to control the output common level.

Fourth Embodiment

Figure 8:
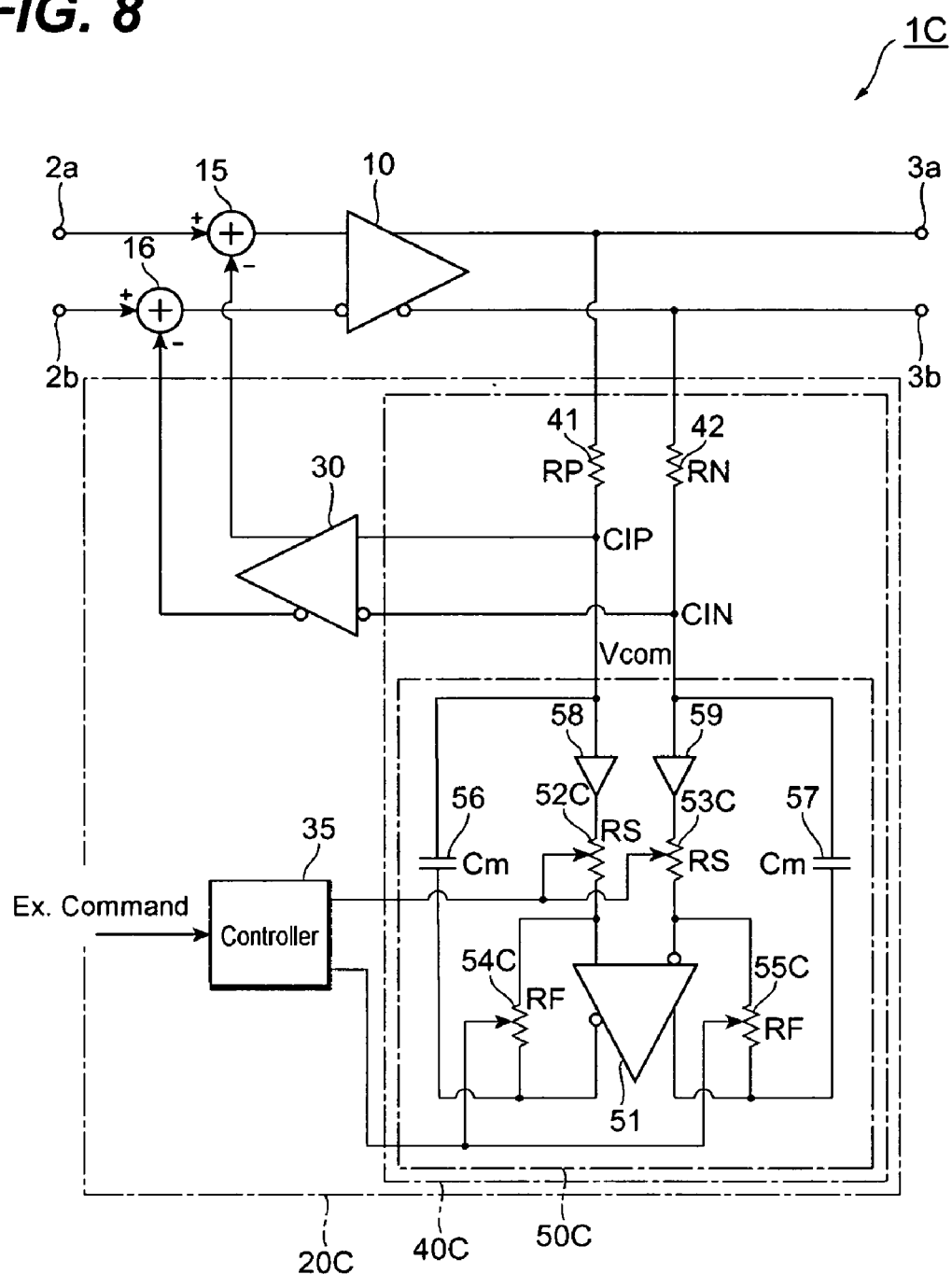
FIG. 8 is a circuit diagram of the differential circuit including the fourth offset canceller according to the present invention.

FIG. 8 is a circuit diagram of the fourth differential circuit 1C providing still another offset canceller 20C. Other configurations except for offset canceller 20C are same with those of afore mentioned differential circuit 1 of the first embodiment.

The offset canceller 20C provides, in place of the capacitance multiplier 50, the modified capacitance multiplier 50C. This capacitance multiplier 50C includes variable resistors, 52C to 55C, which are controllable from the controller 35. The controller 35 may set the ratio RF/RS of the resistor 52C to the resistor 54C and that of the resistor 53C to the resistor 55C. Responding to the system clock or the command externally applied to the controller 35, the controller 35 may vary the ratio RF/RS. Thus, the capacitance multiplier 50C may change the Miller capacitance; consequently, the cut-off frequency of the filter 40C.

It is desirable to stabilize the output of the primary amplifier 10 rapidly when it receives and process a signal with a burst mode. In such an occasion, the filter 40C is necessary to change the cut-off frequency fc thereof. The offset canceller 20C of the present embodiment may vary the Miller capacitance of the capacitance multiplier 50C by varying the closed loop gain of the Op-Amp 51. That is, the controller 35 may change the resistance ratio RF/RS of the resistors, 52C and 54C, and that of the resistors, 53C and 55C. Thus, the cut-off frequency of the filter 40C may be varied.

While the preferred embodiments of the present invention have been described in detail above, many changes to those embodiments may be made without departing from the true scope and teachings of the present invention. For instance, the capacitance multiplier 50B of the second embodiment may provide the function to set the common output level of the Op-Amp 51B, or may provide the function to vary the Miller capacitance by adjusting the resistance of respective resistors. Or, the filter 40A and the filter 40B in the first and second embodiments may provide both Op-Amp 51B in the third embodiment and variable resistors and the controller 35 in the fourth embodiment.

Moreover, the embodiments above explained concentrate on the arrangement that the primary amplifier 10 has the differential configuration, however, the invention, in particular, the offset cancellers, 20 to 20C, may be applicable to a case where the primary amplifier 10 is the single phase amplifier. A trans-impedance amplifier, often used in the front stage of the optical receiver to convert a photocurrent into a voltage signal, outputs the voltage signal by the single phase. The offset cancellers, 20 to 20c, may be combined with the primary amplifier 10 to convert this single phase signal into a differential signal. In such a case, one of the inputs, 2a and 2b, is unconnected, only of the inputs are coupled with the trans-impedance amplifier through the subtractor, or, the output of the offset canceller is directly coupled with one of inputs not coupled with the trans-impedance amplifier. The present invention, therefore, is limited only as claimed below and the equivalents thereof.

What is claimed is:

1. A differential circuit with a function to cancel an input offset voltage of said differential circuit, comprising:
a primary amplifier with a differential configuration having a pair of inputs and a pair of outputs; and
an offset canceller including,
a buffer amplifier with a differential configuration having a pair of inputs and a pair of outputs, said buffer amplifier inversely coupling said outputs of said primary amplifier with said inputs of said primary amplifier, and
a low-pass filter coupled between said outputs of said primary amplifier and said inputs of said buffer amplifier, said low-pass filter including a filtering resistor and a capacitor unit, said filtering resistor connected between said output of said primary amplifier and said input of said buffer amplifier, said capacitance unit including a Miller amplifier with a closed loop gain and a capacitor connected between output and input of said Miller amplifier,
wherein said closed loop gain of said Miller amplifier is independent of an input level of said Miller amplifier.

2. The differential circuit according to claim 1,
wherein said Miller amplifier includes an operational amplifier and at least two gain resistors, one of said gain resistors being connected between an inverting input of said operational amplifier and a non-inverting output of said operational amplifier, and another gain resistor being connected between said inverting input of said operational amplifier and an input of said Miller amplifier, said at least two gain resistors determining a gain of said Miller amplifier by a resistance ratio of said gain resistors, and
wherein said capacitor in said capacitor unit is connected between said input of said Miller amplifier and said output of said operational amplifier.

3. The differential circuit according to claim 2,
wherein said operational amplifier has a function to adjust an output level of said operational amplifier.

4. The differential circuit according to claim 2,
wherein said gain resistors are variable resistors.

5. The differential circuit according to claim 2,
wherein said Miller amplifier further provides a buffer unit in a front end thereof, said another gain resistor is connected between an output of said buffer unit and said inverting input of said operational amplifier, and said capacitor is connected between an input of said buffer unit and said non-inverting output of said operational amplifier.

6. The differential circuit according to claim 1,
wherein said filtering resistor is a trans-conductance amplifier.

7. A differential amplifier with a pair of input terminals for receiving input signals complementary to each other and a pair of output terminals for outputting output signals complementary to each other; said differential amplifier comprising:
a primary amplifier with a pair of inputs and a pair of outputs;
a offset canceller including a filter and a buffer amplifier with a pair of inputs and a pair of outputs, said filter including a pair of filtering resistors and a capacitor unit, said filtering resistors being coupled between said outputs of said primary amplifier and said inputs of said buffer amplifier, said capacitor unit including a Miller amplifier with a differential configuration and a pair of capacitors, one of said capacitors being connected between an inverting input and a non-inverting output of said Miller amplifier and another capacitor being connected between a non-inverting input and an inverting output of said Miller amplifier; and
a subtractor to subtract said outputs of said buffer amplifier from said input signals and to output subtracted signals to said inputs of said primary amplifier,
wherein said Miller amplifier has a closed loop gain independent of an input level of said Miller amplifier.

8. The differential circuit according to claim 7,
wherein said Miller amplifier includes a differential amplifier and first to fourth resistors, said differential amplifier having an inverting input, a non-inverting input, an inverting output and a non-inverting output, said first resistor being connected between said inverting input and said non-inverting output of said differential amplifier, said second resistor being connected between said non-inverting input and said inverting output of said differential amplifier, said third resistor being connected between said inverting input of said differential amplifier and one of input of said Miller amplifier, and said fourth resistor being connected between said non-inverting input of said differential amplifier and another input of said Miller amplifier,
wherein said first to fourth resistors determine said closed loop gain of said Miller amplifier by resistance a ratio thereof.

9. The differential circuit according to claim 8,
further comprising a controller for receiving an external command,
wherein said first to fourth resistors are variable resistors whose resistance is controlled by said controller.

10. The differential circuit according to claim 8,
further comprising a controller to adjust a common mode output of said differential amplifier in said Miller amplifier by responding to an external signal.

11. The differential circuit according to 7,
wherein said filtering resistors are a trans-conductance amplifier with a differential configuration.

* * * * *